(12) United States Patent
Chery et al.

(10) Patent No.: US 9,236,582 B2
(45) Date of Patent: *Jan. 12, 2016

(54) BACK-EMITTING OLED DEVICE

(71) Applicant: SAINT-GOBAIN GLASS FRANCE, Courbevoie (FR)

(72) Inventors: Vincent Chery, Paris (FR); Fabien Lienhart, San Diego, CA (US); Vincent Sauvinet, Grenoble (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/369,362

(22) PCT Filed: Dec. 28, 2012

(86) PCT No.: PCT/FR2012/053099
§ 371 (c)(1),
(2) Date: Jun. 27, 2014

(87) PCT Pub. No.: WO2013/098535
PCT Pub. Date: Jul. 4, 2013

(65) Prior Publication Data
US 2015/0008413 A1 Jan. 8, 2015

(30) Foreign Application Priority Data

Dec. 30, 2011 (FR) ...................................... 11 62589

(51) Int. Cl.
*H01L 29/08* (2006.01)
*H01L 35/24* (2006.01)
(Continued)

(52) U.S. Cl.
CPC ........ *H01L 51/5225* (2013.01); *H01L 51/5203* (2013.01); *H01L 51/5206* (2013.01); *H01L 51/5209* (2013.01); *H01L 51/5212* (2013.01); *H01L 51/5228* (2013.01); *H01L 51/5271* (2013.01); *H01L 2251/5361* (2013.01)

(58) Field of Classification Search
USPC .............................................. 257/40; 438/29
See application file for complete search history.

(56) References Cited

U.S. PATENT DOCUMENTS

| 2008/0197371 | A1  | 8/2008 | Ottermann |         |
|--------------|-----|--------|-----------|---------|
| 2015/0008412 | A1* | 1/2015 | Chery et al. | 257/40 |

FOREIGN PATENT DOCUMENTS

| WO | WO 99/02017   | 1/1999 |
| WO | WO 2008/029060 | 3/2008 |

(Continued)

OTHER PUBLICATIONS

Written Opinion of the International Searching Authority as issued in International Patent Appliation No. PCT/FR2012/053099, dated Jul. 1, 2014.

(Continued)

*Primary Examiner* — Telly Green
(74) *Attorney, Agent, or Firm* — Pillsbury Winthrop Shaw Pittman LLP

(57) ABSTRACT

An OLED device includes an anode, which is transparent, anode of a sheet resistance R1, a cathode of sheet resistance R2, the ratio r=R2/R1 ranging from 0.1 to 5, a first anode contact and a second anode contact, spaced from and facing the first anode contact, and a first cathode electrical contact, which is: arranged above the active zone, offset from the first anode contact and from the second anode contact, at every point of the contact surface.

14 Claims, 8 Drawing Sheets

(51) Int. Cl.
*H01L 51/00* (2006.01)
*H01L 51/52* (2006.01)

(56) References Cited

FOREIGN PATENT DOCUMENTS

| WO | WO 2009/083693 | 7/2009 |
|----|----------------|--------|
| WO | WO 2011/085917 | 7/2011 |
| WO | WO 2011/101766 | 8/2011 |

OTHER PUBLICATIONS

Jordan, R. H., et al., "Efficiency enhancement of microcavity organic light emitting diodes," Appl. Phys. Lett., vol. 69, No. 14, Sept. 30, 1996, pp. 1997-1999.

Neyts, K., et al., "Semitransparent metal or distributed Bragg reflector for wide-viewing-angle organic light-emitting-diode microcavities," J. Opt. Soc. Am. B, vol. 17, No. 1, Jan. 2000, pp. 114-119.

International Search Report issued for International Application No. PCT/FR2012/053099, dated Mar. 28, 2013.

* cited by examiner

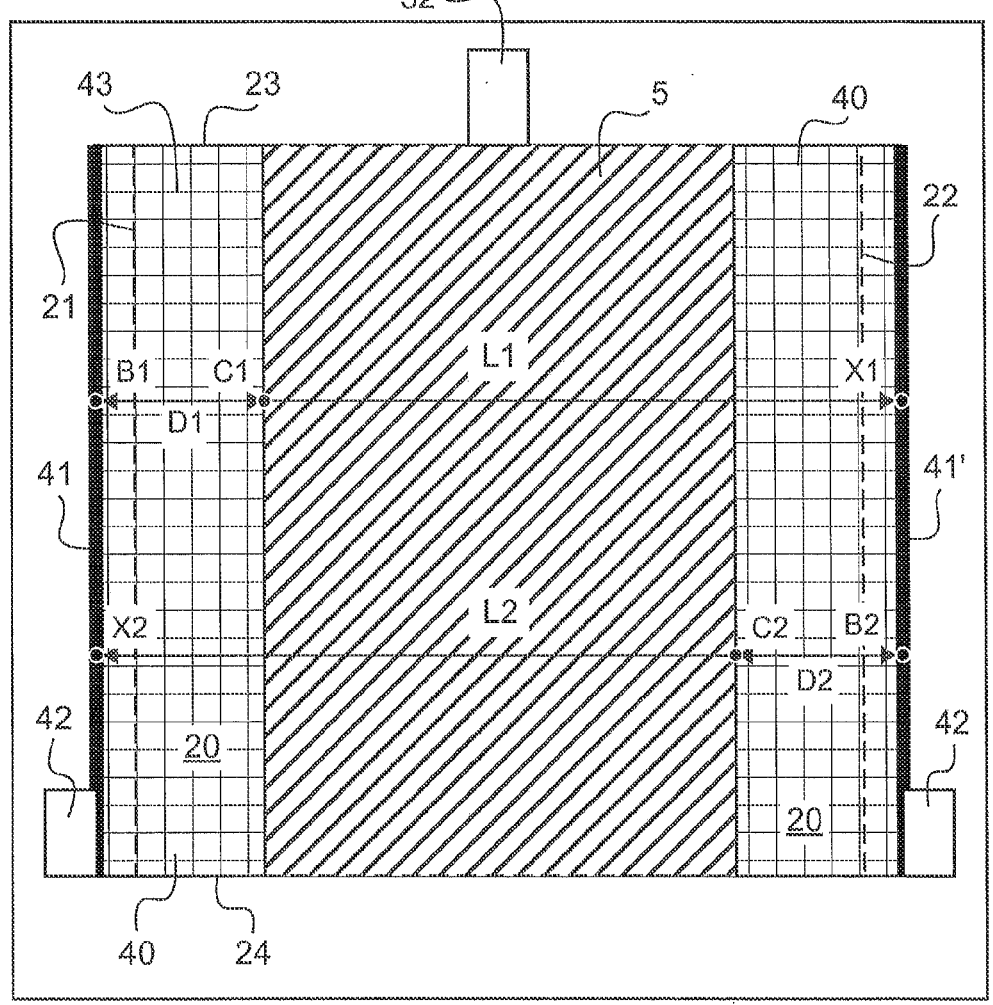
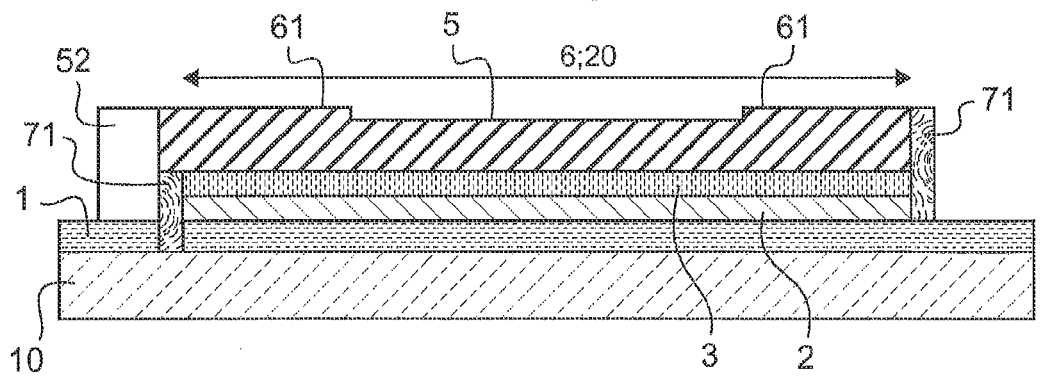

Figure 1:
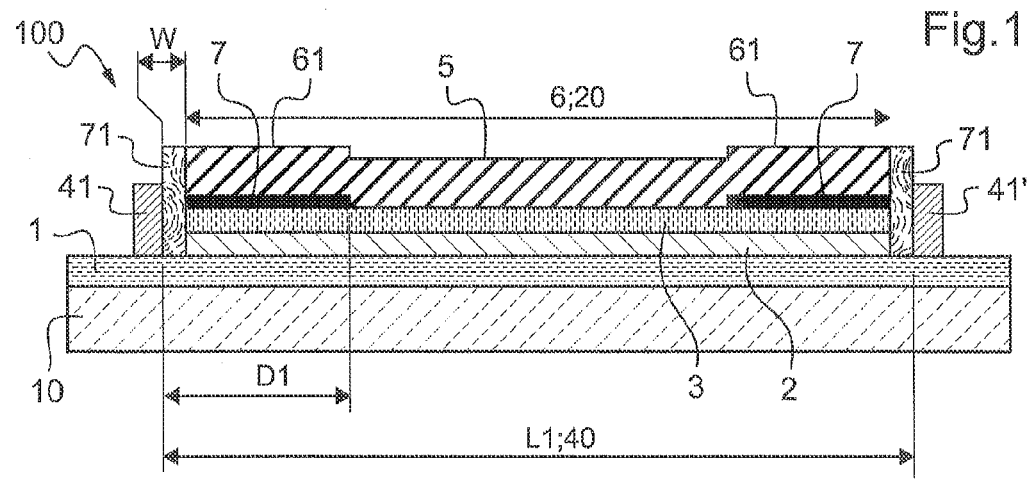

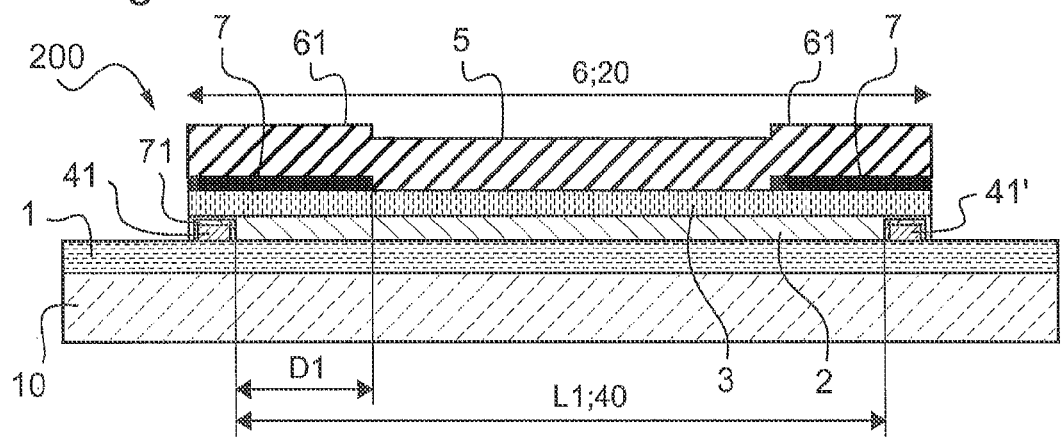
Fig.1'
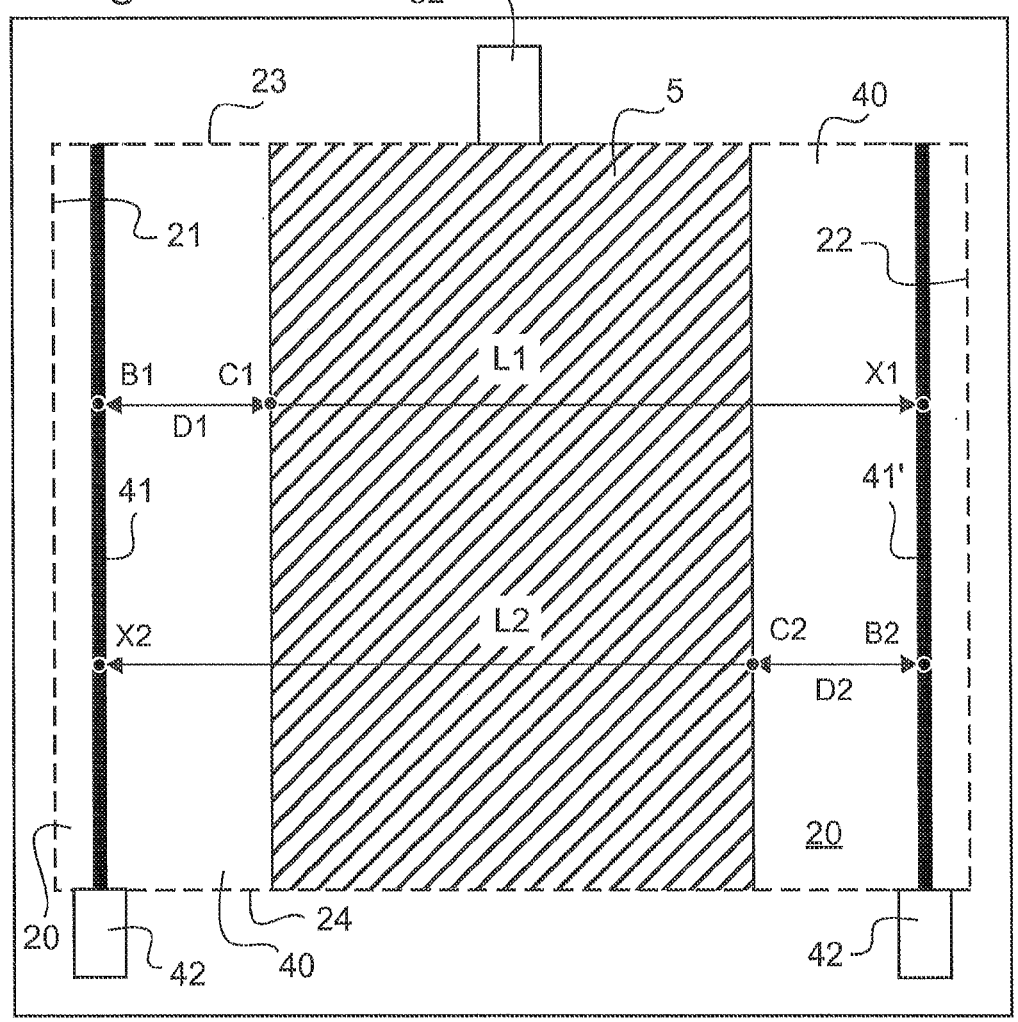
Fig.1'a

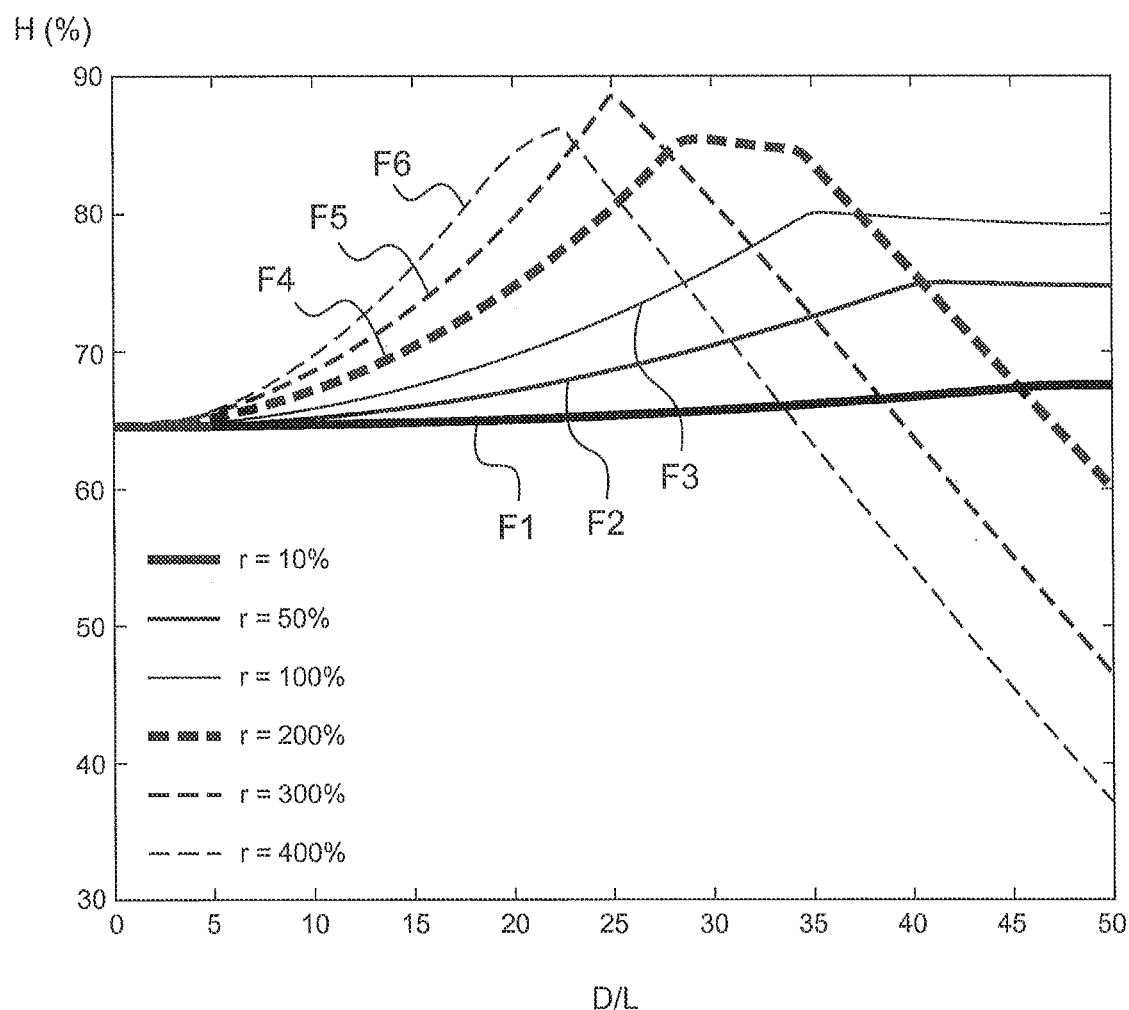

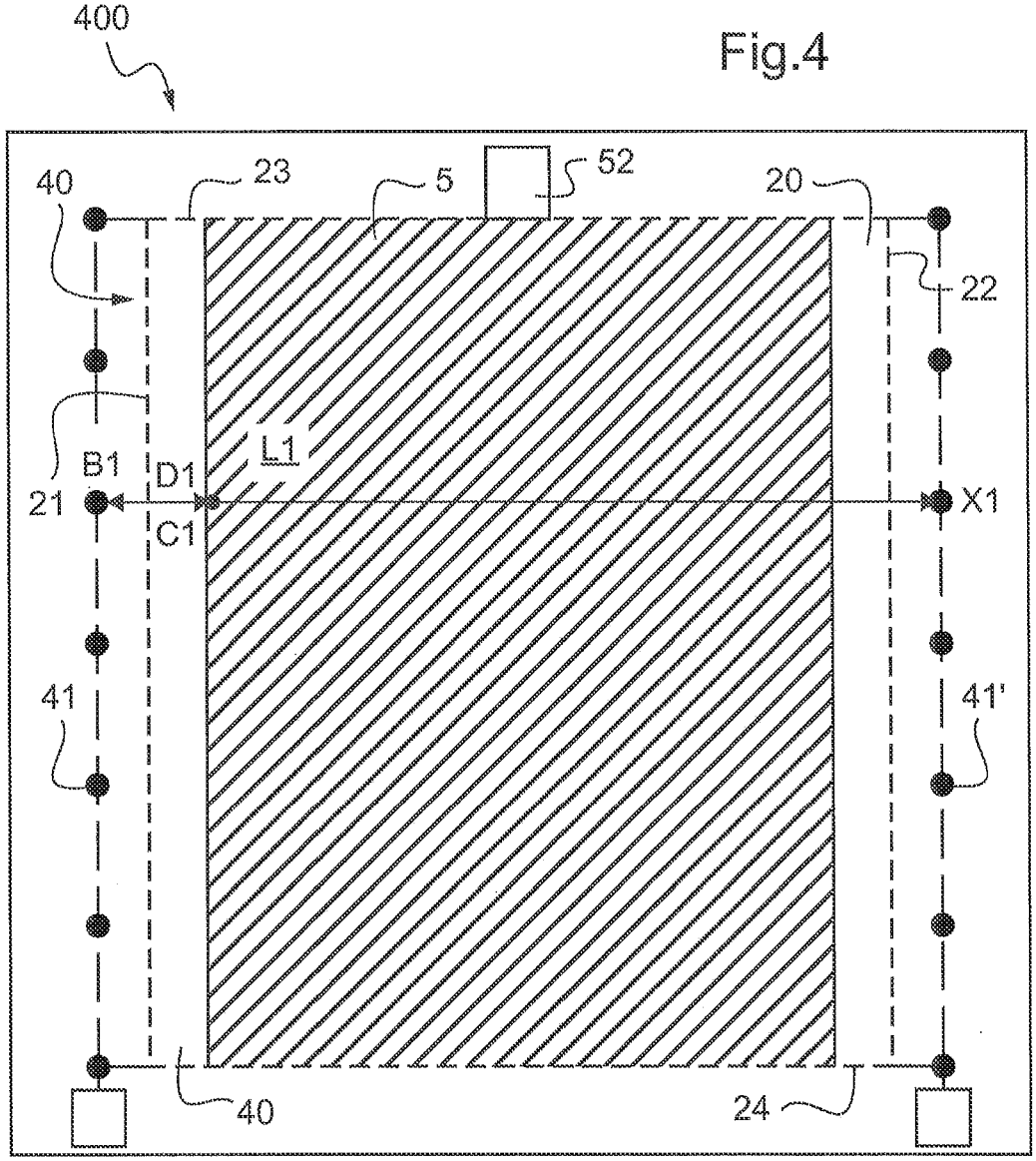

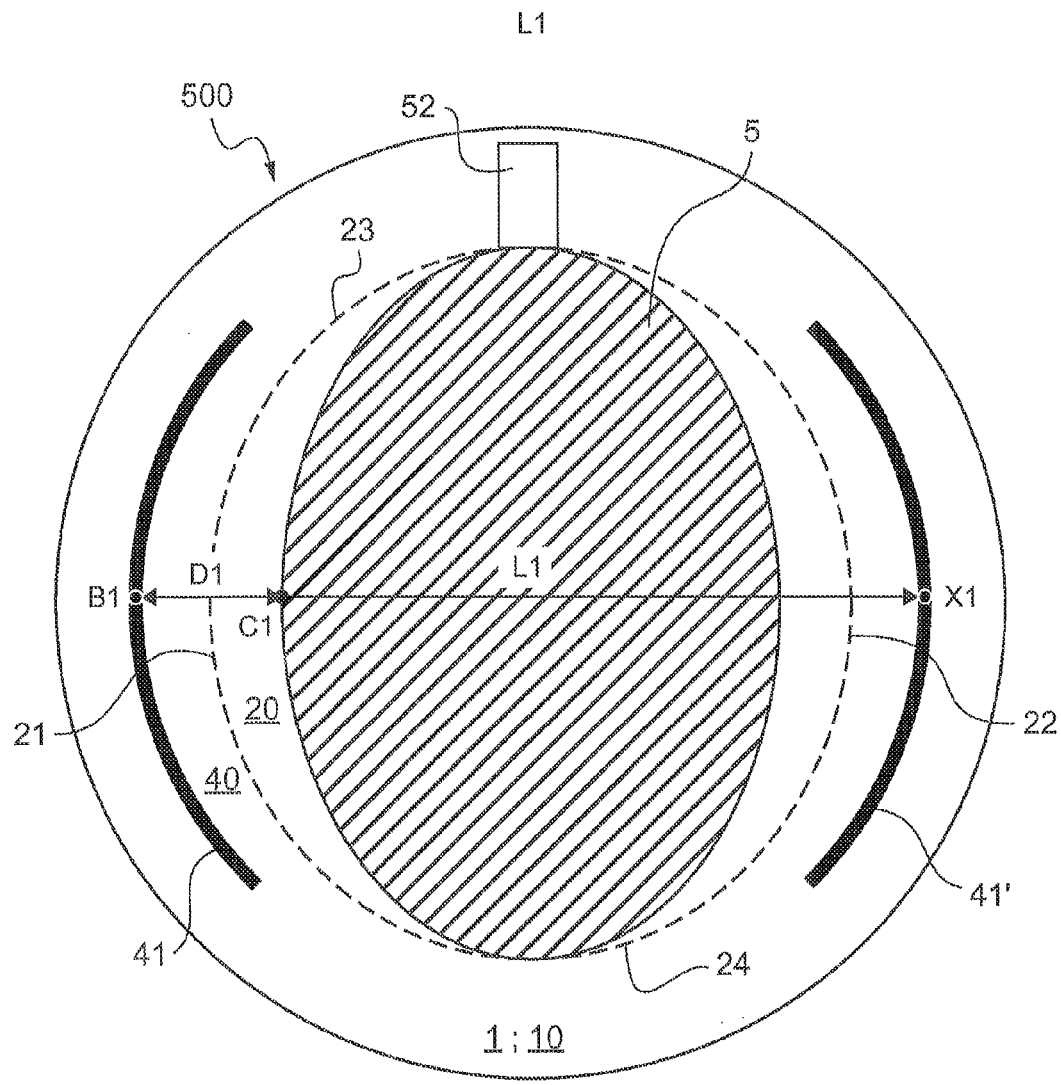

BACK-EMITTING OLED DEVICE

CROSS-REFERENCE TO RELATED APPLICATIONS

This application is the U.S. National Stage of PCT/FR2012/053099, filed Dec. 28, 2012, which in turn claims priority to French Application No. 1162589, filed Dec. 30, 2011. The contents of all of these applications are incorporated herein by reference in their entirety.

The subject of the present invention is an organic light-emitting diode device.

Known organic light-emitting systems or OLEDs (for "Organic Light Emitting Diodes") comprise a stack of organic light-emitting layers supplied with electricity by electrodes bracketing it in the form of electroconducting thin layers. When a voltage is applied between the two electrodes, the electric current passes through the organic layer, thus generating light by electroluminescence.

In a back-emitting OLED device (or "bottom" OLED), the upper electrode, or cathode, is a reflecting metallic layer typically with sheet resistance of less than or equal to 0.1 Ω/square and the lower electrode or anode is a transparent layer, deposited on a glass or plastic substrate allowing the emitted light to pass through, of sheet resistance of several orders of magnitude higher.

Document WO99/02017 notes that a very large difference in sheet resistance between the anode and the cathode leads at one and the same time to an inhomogeneity in the luminance, a decrease in duration and in reliability, most particularly for large-size devices. Hence, it proposes an organic light-emitting diode device with a transparent anode of given sheet resistance R1 and a cathode with a similar given sheet resistance R2, the ratio $r=R2/R1$ lying between 0.3 and 3.

By way of example, the anode is a layer of ITO of sheet resistance 10 ohms and the cathode is a thin layer of ytterbium of sheet resistance 9.9 ohms i.e. r of around 1.

The gain in homogeneity is, however, not yet optimal and is not even certain for all OLED configurations.

Hence, the subject of the present invention is an organic light-emitting diode device, so-called OLED, comprising a transparent substrate with a first main face comprising a stack comprising in this order, starting from said first face:
- (directly on the first face or on a sub-layer for example) a lower electrode forming an anode, which is transparent, preferably comprising at least one electroconducting layer, anode of given sheet resistance R1, in particular R1 less than 30 ohm/square or indeed less than or equal to 15 ohm/square or even 10 ohm/square, the characteristic dimension of the anodic surface preferably being at least 2 cm, or indeed 5 cm,
- an organic light-emitting system above the anode,
- an upper electrode forming a cathode, above the organic light-emitting system (or indeed directly on the system), preferably comprising an electroconducting layer, cathode of given sheet resistance R2, cathode preferably of constant given thickness, with a ratio $r=R2/R1$ ranging from 0.1 to 5
- the anode, the organic light-emitting system and the cathode thus defining a, so-called active, common zone (corresponding to the illuminating surface minus any optional inner anode contacts, if too opaque).

The OLED device furthermore comprises:
- a first tailored anode contact, preferably of extended type or indeed in the form of a plurality of point-like contacts (close together),
- a second tailored anode contact, preferably of extended type or indeed in the form of a plurality of point-like contacts (close together), spaced from and facing the first tailored contact,
- the first and second contacts forming two opposite sides (non-adjacent) of a region of the anode, termed the first anodic region, furthermore delimited by a first so-called free edge of the active zone and by a second so-called free edge of the active zone opposite from the first free edge,
- a first cathode electrical contact, which is:
  - arranged above the active zone, partially covering the region of the cathode above the first anodic region,
  - of given surface, termed the contact surface, smaller than the surface area of the active zone and than the surface area of the first anodic region,
  - offset from the first tailored anode contact and from the second tailored anode contact, at every point of the contact surface.
  - For (at least the majority or indeed 80% and preferably for) each point B1 of the first tailored contact, on defining a distance D1 between said point B1 and that point C1 of the contact surface which is closest to said point B1, and on defining a distance L1 between said point B1 and a point X1 of the second tailored contact, passing through C1 then the following criteria are defined:
    - if $0.1 \leq r < 1.75$, then $10\% < D1/L1 < 50\%$,
    - if $1.75 \leq r < 2.5$, then $10\% < D1/L1 < 45\%$,
    - if $2.5 \leq r < 3$, then $10\% < D1/L1 < 40\%$,
    - if $3 \leq r \leq 5$, then $10\% < D1/L1 < 35\%$,
  - And for (at least the majority or indeed 80% and preferably for) each point B2 of the second tailored contact, on defining a distance D2 between said point B2 and that point C2 of the contact surface which is closest to said point B2, and on defining a distance L2 between said point B2 and a point X2 of the first tailored contact, passing through C2, then the following criteria are defined:
    - if $0.1 \leq r < 1.75$, then $10\% < D2/L2 < 50\%$,
    - if $1.75 \leq r < 2.5$, then $10\% < D2/L2 < 45\%$,
    - if $2.5 \leq r < 3$, then $10\% < D2/L2 < 40\%$,
    - if $3 \leq r \leq 5$, then $10\% < D2/L2 < 35\%$.

The OLED device furthermore comprises above the organic light-emitting system, on moving away from the first face, a reflector covering the active zone.

More rigorously, D1 (respectively D2) is the distance between B1 (respectively B2) and the (orthogonal) projection of C1 (respectively of C2) onto the anode or better into the plane passing through B1 (respectively B2) parallel to the anode, but having regard to the small height of the OLED, this does not change the criteria defined hereinabove.

And likewise more rigorously L1 (respectively L2) is the distance between B1 (respectively B2) and X1 (respectively X2), on passing through the orthogonal projection of C1 (respectively of C2) in the plane passing through B1 (respectively B2) parallel to the anode.

It may therefore be preferred to define D1 and L1 in the plane passing through B1 parallel to the anode and to define D2 and L2 in the plane passing through B2 parallel to the anode.

According to the invention, "tailored anode contact" (the first tailored anode contact and the second tailored anode contact) is intended to mean an electrical contact having sufficient conduction so that, when the OLED is in operation, the voltage is the same at every point of the tailored contact. A result of this conduction property is that, between two points of the tailored contact, the variation in luminance in proximity to these two points is less than 5%. The role of the tailored anode contact is therefore to distribute one and the same electrical potential over the whole of its surface.

According to the invention, the first cathode electrical contact has sufficient conduction such that, when the OLED is in operation, the voltage is the same at any point of the first cathode contact. A result of this conduction property is that, between two points of this cathode contact, the variation in luminance in proximity to these two points is less than 5%. The role of this cathode contact is therefore to distribute one and the same electrical potential over the whole of its surface.

The aim of this invention is to fabricate the largest possible OLED satisfying a criterion of prerequisite luminance homogeneity with an anode of given R1 and a given organic layer resistance rorg in a configuration with two opposite anode contacts.

The Applicant has noted that the positions of the connection arrangements for the anode and cathode, in particular their positioning with respect to one another, as well as their shapes were critical. For a genuine gain in homogeneity, it is thus crucial:
to choose the anode contacts judiciously, in particular their resistance so that they are tailored,
to place the first cathode contact correctly,
and to distance the first cathode contact sufficiently from the opposite tailored anode contacts.

One thus obtains the most constant possible difference of potentials between the cathode and the anode over the whole of the illuminating surface.

The expression opposite edges is taken in the wide sense and incorporates two opposite zones of a rounded anodic region (disk, ovoid contour, etc.) and furthermore is opposed to the term adjacent.

D1 (or D2) may be constant whatever the point B1 (or B2) or vary while remaining with the ratio D1/L1 (or D2/L2) according to the invention which depends drastically on the choice of the ratio r.

The cathode is supplied electrically at a potential Vc, such that the difference of potential(s) between anode and cathode is suitable for lighting, in particular Vc is grounded.

It is considered that a conventional thick cathode is ideal, that is to say it forms by itself a cathode contact (equipotential at every point of the cathode). The invention is distinguished from such a cathode through the increase in the sheet resistance of the cathode R2 and criteria on the contact surface.

The cathode is preferably of constant given thickness in particular with a tolerance as a function of the fabrication method, for example ±10% for a thin layer type deposition.

The OLED according to the invention most particularly intended for lighting also the characteristic dimension, i.e. the largest dimension, such that the length or the diameter of the first anodic region (or of the active zone) can be at least 10 cm or indeed 15 cm.

For better homogenization, the first cathode contact is present in the region the furthest distant from the opposite anode contacts.

It is indeed in this distant region that the anode potential drops most drastically. According to the invention it is therefore necessary to compensate through a drop in potential in the cathode, this drop in potential being generated by the first cathode contact according to the invention.

For the commonplace anodic region shapes (polygons, round, etc.), this is naturally the central region—therefore the center and its surroundings—of the first anodic region.

Thus, the first cathode contact may advantageously extend from the central region (stated otherwise the center) of the first anodic region to the first and second anode contacts, or indeed preferably to one or more free edges of the active zone.

The term free edge is taken in the wide sense, for example several segments if the active zone has numerous sides. It also includes an edge zone in the case of a curved, rounded active zone.

The upper limit of D1/L1 (or D2/L2) recalls that the first cathode contact according to the invention deviates from a contact of point-like (or infinitely fine) type.

It is important that the first cathode contact therefore exhibits a sufficient contact surface.

For example, a cathode contact which then leaves some of the central zone inhomogeneous is not in accordance with the invention. It is possible to cite as counter-examples:
a cathode contact in several pieces which are spaced too far apart in the central zone of the first anodic region,
a hollow cathode contact forming too fine a frame or annulus.

Another counter-example of cathode contact (not in accordance with the invention) would be a cathode contact external to the active zone.

Another counter-example of cathode contact (not in accordance with the invention) would furthermore be a network of resistive or even tailored contacts, such as a grid or parallel bands, occupying just the inner periphery of the active zone (of width D1 or D2) or the whole of the active zone.

The cathode contact according to the invention does not necessarily reproduce the symmetry of the active zone and/or of the first anodic region.

The contact surface can be a solid surface, a grid-like surface (designed to maintain an equipotential), the surface optionally being star-like.

In fact, a contact surface, even solid, can be star-like, and in particular with thicker or thinner branches (in particular that may be regarded as lines).

The (substantially) solid contact surface (in particular a layer deposited on the anode) can exhibit surface discontinuities, but which are unable to disturb its function of equipotential in the region furthest distant from the opposite tailored anode contacts.

The solid surface may in particular be convex at least facing the tailored anode contacts. And, as already indicated, preferably the solid contact surface is not of hollow type.

It is furthermore preferred that the active zone be of solid type. In the case of an active zone with at least one (strong) constriction, it may be preferred not to dispose the tailored anode contacts facing this constriction.

The first cathode contact may be (substantially) centered with respect to the first and second anode contacts (or indeed preferably with respect to the edges of the active zone if external tailored anode contacts).

The first cathode contact has for example a contact surface whose contour is orthogonal to the current lines in the first anodic region, in particular in a polygonal configuration of active region (square, rectangular).

The first cathode contact, in particular centered, may have a surface (substantially) homothetic to the surface of the first anodic region.

At the very least, the contour of the first cathode contact facing the first anode contact may follow the contour of the first anode contact. The contour of the first cathode contact facing the second anode contact may follow the contour of the second anode contact.

The first cathode contact, in particular centered, may have a surface (substantially) homothetic to the surface of the active zone if the tailored contacts are external, in particular for a polygonal active zone.

The cathode contact can be self-supported and overlaid onto the cathode for example a set of wires, sheet-like, etc.

Preferably the thickness of the first cathode contact is constant.

The first cathode contact may preferably be continuous in the first anodic region, in particular is a metallic solid layer (mono or multilayer), and/or preferably the contact surface is not hollow (at least at the center).

For still better homogenization, the following is preferred:
if $0.1 \leq r < 1.75$, then $20\% \leq D1/L1 < 50\%$ and $20\% \leq D2/L2 < 50\%$,
if $1.75 \leq r < 2.5$, then $20\% \leq D1/L1 \leq 40\%$, and $20\% \leq D2/L2 \leq 40\%$,
if $2.5 \leq r < 3$, then $20\% \leq D1/L1 \leq 35\%$, and $20\% \leq D2/L2 \leq 35\%$,
if $3 \leq r \leq 5$, then $15\% \leq D1/L1 \leq 25\%$ and $15\% \leq D2/L2 \leq 25\%$.

In particular the following criteria are preferred
if $0.1 \leq r < 1.75$, then $30\% \leq D1/L1 < 50\%$ and $30\% \leq D2/L2 < 50\%$,
if $1.75 \leq r < 2.5$, then $25\% \leq D1/L1 \leq 35\%$ and $25\% \leq D2/L2 \leq 35\%$,
if $2.5 \leq r < 3$, then $20\% \leq D1/L1 \leq 30\%$, and $20\% \leq D2/L2 \leq 30\%$,
if $3 \leq r \leq 5$, then $15\% \leq D1/L1 \leq 25\%$ and $15\% \leq D2/L2 \leq 25\%$.

The best homogenization is obtained for $2.5 \leq r < 3$ and $20\% \leq D1/L1 < 30\%$, $20\% < D2/L2 < 30\%$.

The first tailored contact for its part may be a solid layer or mesh type layer (tight grid forming a band etc.), or indeed a set of point-like anode contacts sufficiently close together to distribute the current, for example less than a few mm apart.

The first tailored anode contact may be along a first edge of the active zone, internal and/or external to the active zone. It may extend preferably along the majority or indeed substantially along the whole of the first edge. Naturally the first edge is distinct from the first and second free edges.

And optionally the second tailored anode contact, internal and/or external to the active zone, is along a second edge of the active zone opposite from the first edge. These first and second edges are preferably longitudinal (the longest of the edges of the active zone).

The first edge may group together several sides of an active zone as a polygon in particular with n>5 sides. Stated otherwise the first tailored anode contact may extend over several sides. The same holds for the second tailored anode contact.

The first tailored contact (and the second), in particular substantially rectilinear, may therefore be peripheral, peripheral taken in the wide sense therefore:
on an anode edge protruding from the edge of the light-emitting system (and the edge of the cathode above), therefore (at least in part) at the periphery external to the active zone, and in particular separated from the edges of the cathode and the organic layer by a passivation,
and/or on an anode edge covered by the light-emitting system (and by the cathode above) and is passivated by a passivation layer, such as polyimide, therefore (at least in part) at the periphery internal to the active zone.

The first peripheral tailored contact is preferably at a distance W of less than L/10 or indeed than L/20 from the first edge where L is the maximum distance between first and second edge. The second peripheral tailored contact is preferably at a distance W of less than L/10 or indeed than L/20 from the second edge.

Preferably a peripheral tailored contact lies alongside the periphery and is a constant (or nearly so) distance from the periphery of the active zone.

The first peripheral tailored contact, external and/or internal, is preferably at a distance of less than 10 mm, or indeed of less than or equal to 5 mm from the closest edge of the active zone and indeed is (in part) on the edge of the active zone (while protruding from either side).

The first and/or the second tailored anode contact may substantially be rectilinear, be curved etc.

The first tailored anode contact may be substantially rectilinear, in particular with the set of tangents to the first tailored contact forming a fan of straight lines whose angles taken pairwise are less than 30°, and be defined by a first mid-plane M1.

The second tailored anode contact can be substantially rectilinear, in particular with the set of the tangents to the second tailored contact forming a fan of straight lines whose angles taken pairwise are less than 30°, and be defined by a second mid-plane M2.

Preferably the angle α between the (first and second) mid-planes, therefore M1 and M2, is less than 45°, or indeed less than or equal to 30° and better still less than or equal to 10°, or indeed equals 0°.

It is preferred that the first and second contacts be substantially parallel in particular when the active zone is of polygonal type with at least four edges (or sides) and/or according to the contour of the active zone being the simplest (if rounded contour).

The first tailored anode contact may have a length LG1. The second tailored anode contact may have a length LG2 and preferably $0.8 LG1 < LG2 < 1.2 LG1$.

The tailored anode contacts may each be on a distinct half of active zone.

Preferably:
the first and second anode contacts are peripheral and there is no other tailored anode contact,
the first anode contact is peripheral, the second anode contact is (more) internal to the active zone (in particular rectilinear and parallel or at least following said angle α) and there is then a third tailored anode contact, for example peripheral, facing the second anode contact, defining a second anodic region with the second tailored anode contact (adjacent to the first region).

In this second anodic region a second cathode contact defined just as for the first cathode contact is then used with a ratio D3/L3 identical to the ratio D1/L1 for the given r (chosen naturally for the whole set of anodic regions).

It is possible to construct in the same manner an anodic region with first and second tailored anode contacts internal to the active zone (other contacts preferably being present at the periphery).

More broadly, the anode may be contacted by several groups of opposite tailored anode contacts defining a plurality of anodic regions. In each anodic region, the OLED device may comprise a cathode contact (adjacent to an optional covering element or to a Bragg mirror as detailed later) arranged above said anodic region, of given surface smaller than the surface area of the anodic region, partially covering the region of the cathode above said anodic region and offset from the two tailored anode contacts at every point C of the contact surface and meeting the criteria already described for D/L (D1/L1, D2/L2) as a function of r (or r' defined later).

Thus the anodic regions may form a tiling of the anode (therefore of the active zone) with a preferably rectangular, square, honeycomb etc. mesh cell.

The anodic regions are of identical or distinct sizes and of identical or distinct shapes.

Typically the width of a tailored anode contact (extended or indeed point-like) is of the order of a cm. There is probably no light exiting in the active zone endowed with the first tailored anode contact, since the latter is too opaque.

Moreover, in contradistinction to the aforementioned prior art, an acceptable luminance level is safeguarded, via the reflector. Typically the reflector may have a luminous reflection RL (toward the organic system) of at least 80%.

The organic light-emitting system is above the anode:
in particular directly on the anode, by integrating into the anode function also an electroconducting optional planarization,
or else directly on a passivation of tailored anode contact internal to the active zone (as discussed later),
in particular directly on the anode, by integrating into the anode function also an electroconducting optional planarization,
or else directly on a passivation of resistive anode contact internal to the active zone (as discussed later).

Typically, the substrate clad with the anode (anode directly on the substrate or separated by a layer for example for the extraction of light) may have a luminous transmission of at least 70%.

According to the invention, "thin layer" is intended to mean a layer (mono or multilayer if not specified precisely) of thickness less than a micron, or indeed than 500 nm, or indeed than 100 nm.

According to the invention, "layer" is intended to mean a monolayer or multilayer, if not specified precisely.

The OLED device may comprise one or more so-called resistive anode electrical contacts, in particular as an electroconducting layer, arranged in the first anodic region, linked to the first tailored anode contact or indeed to the second tailored anode contact $41'$, optionally interconnected resistive contacts.

And the ratio $r=R2/R1$ ranging from 0.1 and 5 is then replaced with a ratio $r'=R2/R'1$ comprised ranging from 0.1 and 5 in which $R'1$ is the equivalent sheet resistance of the anode/resistive contact(s) assembly in the first anodic region and the criteria for D1/L1 and D2/L2 are retained.

Naturally the following will be preferred:
if $0.1 \leq r' < 1.75$, then $20\% \leq D1/L1 < 50\%$ and $20\% \leq D2/L2 < 50\%$,
if $1.75 \leq r' < 2.5$, then $20\% \leq D1/L1 \leq 40\%$ and $20\% \leq D2/L2 \leq 40\%$,
if $2.5 \leq r' < 3$; then $20\% \leq D1/L1 \leq 35\%$, and $20\% \leq D2/L2 \leq 35\%$,
if $3 \leq r' \leq 5$, then $15\% \leq D1/L1 \leq 25\%$ and $15\% \leq D2/L2 \leq 25\%$.

The resistive contacts are of resistance such that during operation, certain points of the resistive contact are at a potential Vr distinct from the potential of the tailored anode contact by more than 5% as an absolute relation, or indeed at least 10% or even 20%.

The overall resistance of the anode may thus be defined as the placing of the resistance of the resistive contacts in parallel with the resistance of the transparent anode layer.

The resistive contact may be of one and the same material as the tailored contact but much finer, for example less than 1 mm.

For esthetic purposes, an OLED device may be preferred which is divested of one or more tailored anode contacts in the active zone, or indeed divested of one or more resistive anode contacts (even if fairly fine in general) in the active zone.

An anode contact (tailored or resistive) may be in the form of a layer of thicknesses lying between 0.2 to 10 μm and preferably in the form of a monolayer of one of the following metals: Mo, Al, Cr, Nb or an alloy such as MoCr, AlNb or in the form of a multilayer such as Mo/Al/Mo or Cr/Al/Cr.

It may also be a silk-screen-printed silver-based bus bar (silver enamel) or one deposited by ink jet.

It is already known to reduce R1 of the anode by a fairly fine mesh of resistive electrical contacts, typically a square metallic network or honeycomb on the anode.

The strands are of the order of 50 to 100 μm wide and the pitch of the network is in general ⅕ mm, thus giving an occlusion factor of between 1 and 5%.

R'1 can vary from 0.5 to 5 ohms for example. In practice, use is made of a multilayer Mo or Cr (100 nm)/Al (500 nm to 1000 nm)/Mo or Cr (100 nm) is deposited for example on the ITO of 140 nm. This multilayer is thereafter chemically etched, with a photolithography method in general, to form the resistive contacts and optionally the tailored anode contacts in the same substance but wider.

Thus in the anodic region, everything happens as if there were an anode of resistance equivalent to placing the anode and the resistive anode contact or contacts in parallel.

There is then a voltage in the resistive anode contacts which will decrease progressively on moving away from the edges of the OLED.

It may be preferred to position the connection arrangement of the anode outside of the active zone, this is why the connection arrangement (linked with the peripheral tailored anode contact) is placed in an anode contact zone protruding from the active zone.

It may be preferred to position the connection arrangement of the cathode outside of the active zone, this is why the connection arrangement linked with the cathode contact is placed in a "cathode contact" zone protruding from the active zone.

In the same manner, there may be one or more cathode resistive contacts, for example as an electroconducting layer, linked to the first cathode contact, resistive contacts optionally interconnected and in particular distributed over the whole of the zone between the first cathode contact and the edges of the OLED.

In this case, R2 corresponds to the equivalent sheet resistance of the cathode and resistive contact(s) assembly.

The resistive contacts are for example of resistance such that during operation, certain points of the resistive contact are at a potential Vr distinct from the potential of the first cathode contact V by more than 2% as an absolute relation, or indeed at least 4% or even 8%.

In an anode contact free edge, it is possible to thus supply the cathode:
by making the cathode contact overhang out of the active zone, via one of its ends, this zone no longer being defined as a cathode contact zone but as a cathode connection arrangement zone
or by making the reflector overhang out of the active zone on one side.

Moreover, on account of the tailoring of R2, the cathode can be transparent or semi-reflecting, in particular of reflection RL less than 80%, or indeed less than or equal to 60%, or indeed 50%.

The cathode allows the emitted light to pass through, preferably without absorbing too much.

In a first configuration (with the transparent or semi transparent cathode), the reflector can comprise a metallic reflecting covering element, in particular (thin) layer(s), above the cathode on moving away from the first main face, the covering element being separated from the cathode by an electrical insulating element, in particular layer, a so-called insert.

The first cathode contact, adjacent to the insert (and at least partially surrounded by the insert), can also form part of the reflector and is preferably in contact or indeed electrically coupled with the reflecting covering element.

The reflecting covering element may be:
- a layer, deposited by physical vapor phase deposition on the insert, or on an inner face of a counter-element (glass, plastic film etc.) overlaid against the insert (in optical contact preferably)
- a metallic sheet: Cu, stainless steel, Alu, Ag etc.

The reflecting covering element, preferably layer-like, is for example based on at least one metal chosen from among Al, Ag, Cu, Mo, Cr.

The insert can be chosen to allow the emitted light to pass through, preferably without absorbing too much. For example the insert is transparent, preferably of TL>90%, and quite non-absorbent in particular A<3%.

The insert may be:
- a layer deposited on the thin layer cathode deposited by physical vapor phase deposition, or indeed a glue if the reflector is a plate (stainless steel etc.) etc.
- air, the reflector being separated by spacers, peripheral to the active zone,
- an overlaid film, for example a lamination insert (PVB type) and the reflector is for example a glass substrate with a reflecting layer.

The insert preferably comprises or indeed consists of a (mono)layer (in particular of thickness less than 100 nm, thickness adjusted as a function of its absorption) which is
- mineral, preferably chosen from among a nitride, an oxide, an oxynitride, for example a silicon nitride,
- or a resin for example identical to the resin for passivating the OLED edges, in particular of polyimide,
- and/or optionally is diffusing for example by addition of diffusing particles, in particular mineral, in a binder, in particular mineral.

Preferably, in this first configuration, the first cathode contact comprises a layer based on the same material as the metallic covering element, preferably which is a layer based on aluminum.

The cathode contact may be:
- a layer deposited on the cathode: conducting glue, layer deposited by ink jet or silk-screen printing according to the form desired, thin layer deposited by PVD and if necessary patterned, a soldered joint or indeed a weld etc.
- and/or an overlaid film with the predetermined form: foil leaf etc.

The cathode contact, preferably layer-like, is based on at least one metal preferably chosen from among Al, Ag, Cu, Mo, Cr.

In particular, the cathode contact and the reflecting covering element can be formed by a continuous layer on the insert (layer-like) and the cathode, and preferably the cathode contact, or indeed the continuous layer, is based on the same material as the cathode, in particular aluminum.

In this manner in the off state, the continuous layer can form a mirror and the cathode contact is not differentiated from the covering element.

It may be desired to use a single deposition technique (for example physical vapor phase PVD, in particular cathodic sputtering or evaporation) for the covering element and the cathode contact (and even the cathode or else the insert), or indeed even a single step of layer deposition for the covering element and the cathode contact.

More broadly, among the possible materials for the cathode may be cited
metals: aluminum, beryllium, magnesium, calcium, strontium, barium, lanthanum, hafnium, indium, bismuth, and lanthanides: cerium, praseodymium, neodymium, samarium, europium, gadolinium, terbium, dysprosium, holmium, erbium, thulium, ytterbium, and lutetium.

Preferred in particular are aluminum, silver, barium, calcium, samarium which are often used for their low work function.

Table 1 hereinbelow gives
- the R2 of the aluminum (which may be transparent or semi transparent as a function of the chosen thickness),
- the R2 of the samarium, of resistivity (per unit mass) of 900 nohm·m, which may be transparent or semi transparent as a function of the chosen thickness and
- the R2 of the barium, of resistivity (per unit mass) of 332 nohm·m, which is transparent or semi transparent as a function of the chosen thickness.

TABLE 1

| Thickness (nm) | R2 ($\Omega$/□) for Al | Thickness (nm) | R2 ($\Omega$/□) for Ba | Thickness (nm) | R2 ($\Omega$/□) for Sm |
|---|---|---|---|---|---|
| 10 | 5 | 5 | 66 | 10 | 90 |
| 20 | 2.5 | 10 | 33 | 50 | 18 |
| 50 | 1 | 30 | 11 | 100 | 9 |
| 100 | 0.5 | 50 | 6 | 200 | 4.5 |
| 200 | 0.25 | 75 | 4 | | |
| 500 | 0.1 | 100 | 3 | | |

It is preferred that R2 be greater than or equal to 1 or indeed than 3 ohm/square and less than 20 ohm/square.

In a preferred manner, the cathode is based on at least one metal, preferably chosen from among Al and Ag, with optionally a layer of LiF subjacent to the metal layer and for example of thickness <than 3 nm.

Most particularly the cathode can comprise, or indeed is constituted, of a layer based on aluminum and the cathode contact is a layer based on aluminum, forming for example a thickening on the aluminum cathode layer.

In a second configuration (with the transparent or semi transparent cathode), the reflector is a Bragg mirror, Bragg mirror arranged on the cathode and adjacent to the cathode contact, and the cathode contact forms part of the reflector.

The Bragg mirror is known as a stack formed of an alternation of thin layers of high refractive index n1, such as TiO2, ZrO2, Al2O3, Si3N4, and of thin layers of lower index n2, such as SiO2, CaF2.

For example the delta of index n2-n1 is at least 0.3, and preferably at least 0.6, and the stack comprises at least two high-index layers and two low-index layers.

Thus, for an OLED of wavelength centered near 570 nm, it will be possible to envisage a multilayer stack TiO2 60 nm/SiO2 95 nm, or indeed optionally the superposition of this multilayer stack.

The use of Bragg mirrors for OLEDs is well known to the person skilled in the art, who will optionally be able to refer to the following publications:

Appl. Phys. Lett. 69, 1997 (1996); Efficiency enhancement of microcavity organic light emitting diodes; R. H. Jordan, A. Dodabalapur, and R. E. Slusher, JOSA B, Vol. 17, Issue 1, pp. 114-119 (2000), Semitransparent metal or distributed Bragg reflector for wide-viewing-angle organic light-emitting-diode microcavities; Kristiaan Neyts, Patrick De Visschere, David K. Fork, and Greg B. Anderson.

The cathode contact may touch the Bragg mirror.

The cathode contact is connected for example by one of its ends protruding from the active zone then forming a cathode connection arrangement zone.

The invention will now be described in greater detail with the aid of nonlimiting examples and of figures.

Figure 1A:
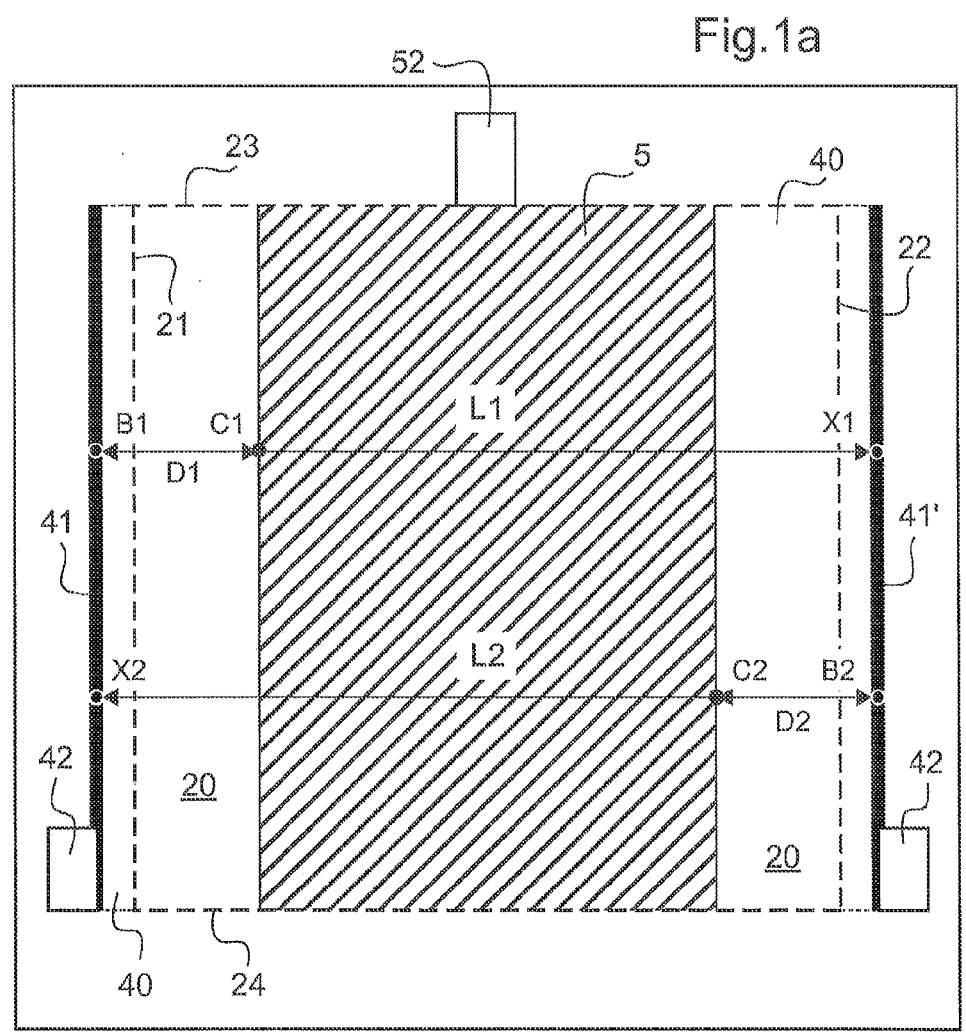
Figure 2:
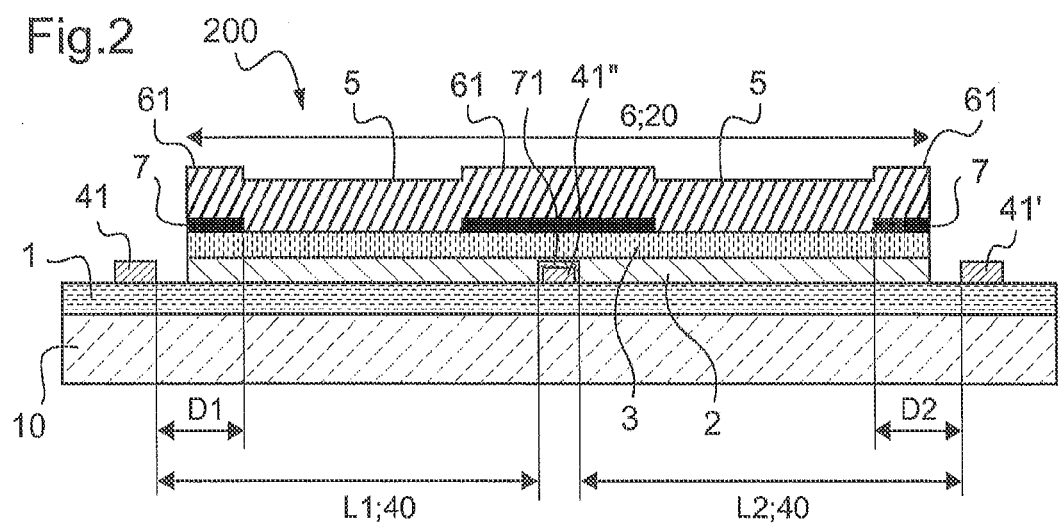
Figure 2A:
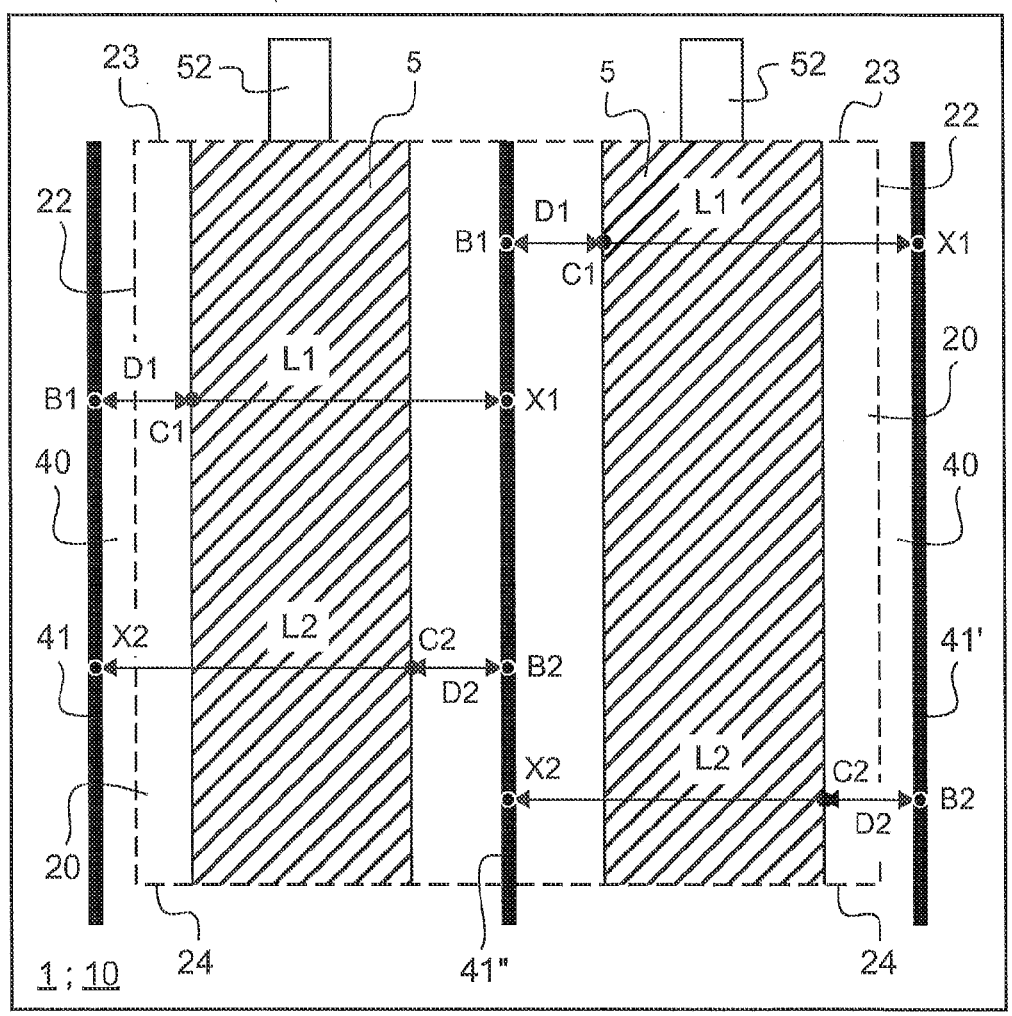

FIG. 1 is a sectional schematic view of an OLED device in accordance with the invention, FIG. 1a is a schematic view from above of the OLED device of FIG. 1, showing the anode and cathode contacts, FIG. 1b is a schematic view from above of the OLED device of FIG. 1 in a variant, FIG. 1c is another sectional schematic view of the OLED device of FIG. 1, showing the cathode connection arrangement, FIG. 1' is a sectional schematic view of an OLED device in accordance with the invention, FIG. 1'a is a schematic view from above of the OLED device of FIG. 1', showing the anode and cathode contacts, FIG. 2 is a sectional schematic view of an OLED device in accordance with the invention, FIG. 2a is a schematic view from above of the OLED device of FIG. 2, showing the anode and cathode contacts, FIG. 3 shows the graphs of homogeneities of the luminance as a function of D1/L1, FIGS. 4 to 6b are schematic views from above of the OLED devices, showing the anode and cathode contacts with various shapes of active zones.

It is specified that for the sake of clarity the various elements of the objects (including the angles) represented are not reproduced to scale.

FIG. 1, intentionally very schematic, represents in section an organic light-emitting device with emission through the substrate or "bottom emission".

The OLED device 100 (readily connectable in series) comprises a transparent substrate with a first main face 10 comprising a stack comprising in this order, starting from said first face:
- a lower electrode forming an anode 1, which is transparent, preferably comprising at least one electroconducting layer, anode of given sheet resistance R1, for example a TCO or a silver-based stack,
- an organic light-emitting system 2 above the anode (including layer HTL and ETL),
- an upper electrode forming a cathode 3, transparent or semi-reflecting, above the organic light-emitting system, comprising an electroconducting layer, cathode of given sheet resistance R2 of constant given thickness, the ratio r=R2/R1 going from 0.1 to 5, the stack thus defining a, so-called active, common zone 20.

A potential V, for example 4V or 10 V, is applied at the boundary of the anode 1 via two first and second peripheral anode electrical contacts 41, 41', metallic (multi)layers for example. They are termed tailored that is to say of electrical resistance tailored so as to be, during operation, at the potential V at every point.

The first tailored contact 41 is here outside the active zone 20 on a first longitudinal edge 21 of the active zone.

The second tailored contact 41 is here outside the active zone 20 on a second longitudinal edge 21 of the active zone, opposite from the first edge 22 (see FIG. 1a).

The invention thus consists of an OLED module of which both the ratio r (or r') and the geometry of the electrical connections on the two electrodes are adjusted in such a way that the voltage drops which take place in the two electrodes compensate one another so as to maintain the most uniform possible voltage difference between the two electrodes.

For any point B1 of the first tailored anode contact 41, on defining a distance D1 between said point B1 and that point C1 of the contact surface which is closest to said point B, and on defining a distance L1 between said point B1 and a point X1 of the second tailored contact 41', passing through C1, then the following criteria are defined:
if $0.1 \leq r < 1.75$, then $10\% < D1/L1 < 50\%$,
if $1.75 \leq r < 2.5$, then $10\% < D1/L1 < 45\%$,
if $2.5 \leq r < 3$, then $10\% < D1/L1 < 40\%$,
if $3 \leq r \leq 5$, then $10\% < D1/L1 < 35\%$, for each point B2 of the second tailored contact 41, on defining a distance D2 between said point B2 and that point C2 of the contact surface which is closest to said point B2, and on defining a distance L2 between said point B2 and a point X2 of the first tailored contact 41, passing through C2, then the following criteria are defined:
if $0.1 \leq r < 1.75$, then $10\% < D2/L2 < 50\%$,
if $1.75 \leq r < 2.5$, then $10\% < D2/L2 < 45\%$,
if $2.5 \leq r < 3$, then $10\% < D2/L2 < 40\%$,
if $3 \leq r \leq 5$, then $10\% < D2/L2 < 35\%$.

And better still
if $0.1 \leq r < 1.75$, then $20\% \leq D1/L1 < 50\%$ and $20\% \leq D2/L2 < 50\%$,
if $1.75 \leq r < 2.5$, then $20\% \leq D1/L1 \leq 40\%$ and $20\% \leq D2/L2 \leq 40\%$,
if $2.5 \leq r < 3$, then $20\% \leq D1/L1 \leq 35\%$ and $20\% \leq D2/L2 \leq 35\%$,
if $3 \leq r \leq 5$, then $15\% \leq D1/L1 \leq 25\%$ and $15\% \leq D2/L2 \leq 25\%$.

More rigorously, D1 (respectively D2) is the distance between B1 (respectively B2) and the orthogonal projection of C1 (respectively of C2) in the plane passing through B1 (respectively B2) parallel to the anode. And more rigorously L1 (respectively L2) is the distance between B1 (respectively B2) and X1 (respectively X2), on passing through the orthogonal projection of C1 (respectively of C2) in the plane passing through B1 (respectively B2) parallel to the anode. It may therefore be preferred to define D1 and L1 in the plane passing through B1 parallel to the anode and to define D2 and L2 in the plane passing through B2 parallel to the anode.

The contact surface is here a solid surface, as a variant it is grid-like.

The OLED device 100 comprises above the organic light-emitting system 2, on moving away from the first face 10, a reflector 6 covering the active zone 20.

More precisely, the reflector 6 comprises a metallic reflecting covering element 61, above the cathode 3 on moving away from the first main face, the covering element 61 being separated from the cathode 3 by an electrically insulating electrical element 7, a so-called insert, transparent and quite non-absorbent, here a layer preferably mineral and thin, such as 50 nm of silicon nitride.

The first cathode contact 5, adjacent to the insert 7, is reflecting, therefore forms part of the reflector 6 and is preferably in contact or indeed electrically coupled with the reflecting covering element 61.

The cathode contact 5 is preferably based on the same material as the metallic covering element 61. The cathode contact 5 and the covering reflector 6 are then formed by a continuous layer on the insert 7 and the cathode 3 for example by physical vapor phase deposition. Preferably this continuous layer is based on aluminum for example 100 nm, or indeed of 500 nm in thickness. Naturally the insert 7 has been structured before the deposition so as to leave a free zone corresponding to the zone intended to be the zone of the cathode contact.

The edges of the active zone 20 are for example passivated by polyimide resin for example 71.

The anode contacts 41, 41' are here on the anode 1 therefore deposited previously on the substrate (or on a subjacent layer). However, the anode 2 may equally well be deposited after the anode contacts 41, 41' and partially overlap them for its electrical bonding.

As a variant, not represented, the reflector comprises a Bragg mirror adjacent to said first cathode contact. The, reflecting, cathode contact then still forms part of the reflector. The Bragg mirror (of dielectric materials) may be directly on the cathode.

The cathode 3 is for example an aluminum layer, in particular of R2 greater than or equal to 1 ohm/square, or indeed greater than or equal to 3 ohm/square and less than 20 ohm/square or indeed than 10 ohm/square, the cathode contact is then preferably a layer based on aluminum, as already indicated.

The active zone 20 is for example at least 5 cm by 5 cm.

FIG. 1a illustrates a schematic view from above of the device 100 showing a part of the elements of the device for greater clarity, namely the elements with electrical function.

The rectangular cathode contact 5 extends over first and second free edges 23, 24 of the active zone 20 and is contacted outside of the active zone beyond the free edge 22 and for example is deposited on or under a contact pad 52 (see FIG. 1c).

The first and second tailored anode contacts 41 are parallel rectilinear bands. The active zone 20 (defined here simply by its contours, dashed), is square.

The edges 23, 24 of the active zone which are adjacent to the first and second edges are therefore not provided with anode contacts.

By way of illustration, we have plotted a point B1 of the first anode contact, the point C1 of the cathode contact 5 closest to the point B1, and the point X1 of the second edge 22. The straight line passing through B1, through the orthogonal projection of C1 in the plane of B1 parallel to the anode and passing through X1, makes it possible to best define L1 and D1.

By way of illustration, we have plotted a point B2 of the second anode contact 41', the point C2 of the cathode contact 5 closest to the point B2, and the point X2 of the first edge 21. The straight line passing through B2, through the orthogonal projection of C2 in the plane of B2 parallel to the anode and passing through X2, makes it possible to best define L2 and D2.

Practically the space between the first tailored contact 41 and the first edge 21 is restricted. The first outer peripheral tailored contact is preferably at a distance W of less than L/10 or indeed than L/20 from the first edge where L is the distance here constant between first and second edges 21 and 22 (equal to L1).

Practically the space between the second tailored contact 41 and the second edge 22 is restricted. The second outer peripheral tailored contact is preferably at a distance W of less than L/10 or indeed than L/20 from the second edge.

We choose L=15 cm, Rorg=300 ohm·cm$^2$, an anode of 3 ohm/square, and the homogeneity H of the luminance is defined as the ratio between the minimum luminance over the maximum luminance for an OLED supplied at a given voltage above the OLED turn-on voltage.

FIG. 3 shows the graphs of homogeneity H as a function of D1/L1 of the cathode contact 5 of the device 100 shown in FIG. 1, for various ratios r (between 0.1 and 4).

Depicted therein are six curves F1 to F6 of homogeneity H (in %) respectively for r=0.1; r=0.5; r=1; r=2; r=3; r=4.

These graphs F1 to F6 recall the suitable parameter spans for D1/L1, in particular toward low values of r, the optimal span is narrower but H is better.

The results for H are similar (follow the same trend) with a different Rorg, typically between 50 and 300 ohm·cm$^2$, an anode of different R1 typically between 1 and 10 ohm per square, and for any other size of active zone.

We choose for example r=3 and D1/L1=25% with an ITO anode of R1=8 ohm per square and a cathode of R2=24 ohm per square; or else a silver-based anode of R1=3 ohm per square and a cathode of R2=9 ohm per square.

It is also possible to choose a lower r, for ease of fabrication, for example with r=1 and D/L=35%=>with an ITO anode of R1=8 ohm per square and a cathode of R2=8 ohm per square; or else a silver-based anode of R1=3 ohm–cathode of R2=3 ohm per square.

To produce an anode of R1 equal to 3 ohm per square, a silver-based stack is preferred to a transparent conducting oxide "TCO" such as ITO. It is possible to cite for example the silver-based monolayer or silver-based bilayer stacks described in applications WO 2008/029060 and WO 2009/083693.

To produce the cathode, aluminum is deposited while adjusting the thickness.

FIG. 1b is a schematic view from above of the OLED device of FIG. 1, in a variant.

Resistive anode electrical contacts 43, in electroconducting layer, linked to the tailored anode contacts 41, 41' are added. Here these resistive contacts 43 are interconnected and form a grid.

Hence to obtain good homogeneity of illumination, the ratio r is replaced with a ratio r'=R2/R'1 in which R'1 is the equivalent sheet resistance of the anode/resistive anode contact(s) assembly, that is to say the placing in parallel of the anode and of the resistive anode contacts.

The resistive anode contact may be made of one and the same material as the tailored contacts but much finer for example of under 1 mm. For example, a square mesh of metallic strands of a period of 5 mm, produced with the aid of aluminum wires 500 nm in height and 100 µm in width forms a system having an equivalent sheet resistance of 2.7 ohm per square. If such a mesh is placed on an ITO anode of sheet resistance 20 ohm per square, the equivalent resistance of the anode (defined as the resistance resulting from the placing in parallel of the anode and of the resistive contacts) is then 2.4 ohm per square. By producing on this anode an OLED of square active zone of 8×8 cm$^2$, having a vertical resistance of the organic materials of 100 ohm·cm$^2$, the illumination will be in proximity to a resistive contact situated 4 cm from the edge of the OLED will be 20% lower. This illumination decrease of greater than 5% is attributed to the resistive character of the resistive contacts which bring about a decrease in the voltage of the anode at the center of the OLED, bringing about the drop in illumination.

FIG. 1' is a sectional schematic view of an OLED device 200 in accordance with the invention.

It differs from the first device 100 in that the anode contacts 41, 41' lie alongside the periphery of the edges internally. The active zone 20 is therefore larger than the first anodic region 40.

FIG. 1'a is a schematic view from above of the OLED device of FIG. 1', showing the anode and cathode contacts similar to those shown in FIG. 1a.

FIG. 2 is a sectional schematic view of an OLED device 300 in accordance with the invention.

It differs from the first device 100 in that there is a middle inner anode contact; equidistant for example, from the first and second anode contacts 41, 41'.

A first anodic region 40 is therefore defined with the first peripheral contact 41 and the middle contact 41" and a second anodic region 40' with the middle contact and the second peripheral tailored contact.

The active zone 20 is therefore larger than the first anodic region 40.

In each anodic region 40, 40' is placed a first cathode contact 5, here rectangular spaced from the anode contacts so as to satisfy the ratios D1/L1 and D2/L2 as a function of the chosen r (same r for all the anodic regions preferably).

FIG. 4 is a schematic view from above of an OLED device 400 in accordance with the invention, showing the anode and cathode contacts.

It differs from the first device 100 in that the first and second tailored anode contacts 41, 41' are no longer bands but each a set of point-like contacts sufficiently close together still along a longitudinal edge of the active zone.

FIG. 5 is a schematic view from above of an OLED device 500 in accordance with the invention, showing the anode and cathode contacts.

It differs from the first device 100 in that the active zone 20 is round (ovoid for example) and the first and second tailored anode contacts 41, 41' are no longer rectangular bands but C-shaped giving a first, likewise round, anodic region 40.

The first cathode contact is also of rounded shape, for example a constant distance from the tailored contacts 41, 41'.

Figure 6A:
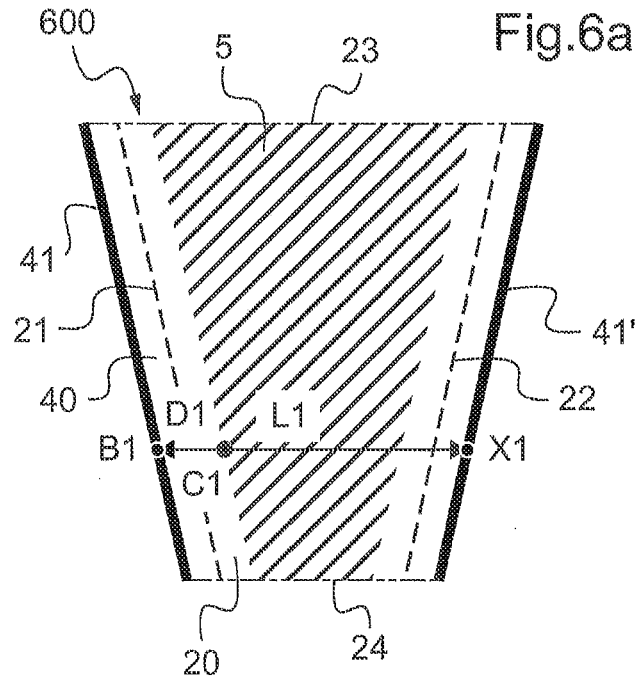

FIG. 6a is a schematic view from above of an OLED device 600 in accordance with the invention, showing the anode and cathode contacts.

It differs from the first device 100 in that the active zone 20 (and the first anodic region 40) is a quadrilateral, as is the cathode contact 5 also. The first and second contacts remain on the longest edges 21, 22.

Figure 6B:
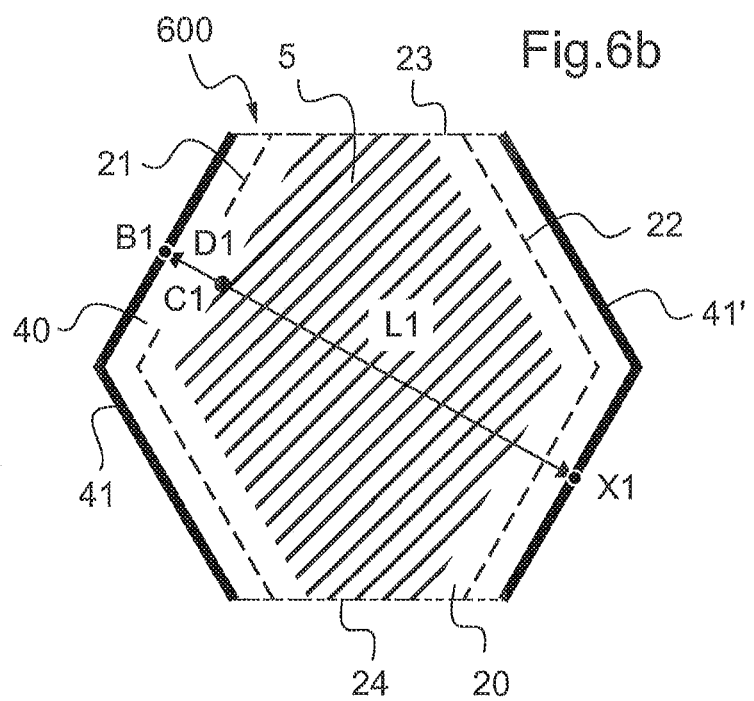

FIG. 6b is a schematic view from above of an OLED device 600' in accordance with the invention, showing the anode and cathode contacts.

It differs from the first device 100 in that the active zone 20 (and the first anodic region 40) is a hexagon, as is the cathode contact 5 also. The first and second anode contacts 41, 41' are each on two adjacent sides 21,22, thus forming as it were longitudinal edges. There remain two free sides or edges 23, 24.

The invention claimed is:

1. An organic light-emitting diode device, comprising:
  a transparent substrate with a first main face comprising a stack comprising in this order, starting from said first main face:
    a lower electrode forming an anode, which is transparent, the anode having a sheet resistance R1,
    an organic light-emitting system above the anode,
    an upper electrode forming a cathode, arranged above the organic light-emitting system, comprising an electroconducting layer, the cathode having a sheet resistance R2, the ratio r=R2/R1 ranging from 0.1 to 5, the anode, the organic light-emitting system and the cathode defining an active common zone,
  a first anode contact,
  a second anode contact, spaced from and facing the first anode contact, the first and second anode contacts forming two opposite sides of a first region of the anode, the first region being further delimited by a first free edge of the active common zone and by a second free edge of the active common zone opposite from the first free edge,
  a first cathode electrical contact, which is:
    arranged above the active common zone, partially covering a region of the cathode above the first region,
    of a contact surface smaller than a surface area of the active common zone and than a surface area of the first region,
    offset from the first anode contact and from the second anode contact, at every point of the contact surface, and
    above the organic light-emitting system, away from the first main face, a reflector covering the active common zone,
  wherein, for each point B1 of the first anode contact, on defining a distance D1 between said point B1 and a point C1 of the contact surface which is closest to said point B1, and on defining a distance L1 between said point B1 and a point X1 of the second anode contact, passing through C1 then the following criteria are defined:
    if $0.1 \leq r < 1.75$, then $10\% < D1/L1 < 50\%$,
    if $1.75 \leq r < 2.5$, then $10\% < D1/L1 < 45\%$,
    if $2.5 \leq r < 3$, then $10\% < D1/L1 < 40\%$,
    if $3 \leq r \leq 5$, then $10\% < D1/L1 < 35\%$,
  and wherein, for each point B2 of the second anode contact, on defining a distance D2 between said point B2 and a point C2 of the contact surface which is closest to said point B2, and on defining a distance L2 between said point B2 and a point X2 of the first anode contact, passing through C2 then the following criteria are defined:
    if $0.1 \leq r < 1.75$, then $10\% < D2/L2 < 50\%$,
    if $1.75 \leq r < 2.5$, then $10\% < D2/L2 < 45\%$,
    if $2.5 \leq r < 3$, then $10\% < D2/L2 < 40\%$,
    if $3 \leq r \leq 5$, then $10\% < D2/L2 < 35\%$.

2. The organic light-emitting diode device as claimed in claim 1, wherein the contact surface extends from a center of the first region to the first and second anode contacts.

3. The organic light-emitting diode device as claimed in claim 1, wherein the contact surface is a solid surface, or a grid-like surface.

4. The organic light-emitting diode device as claimed in claim 1, wherein the first cathode electrical contact is centered with respect to the first anode contact and to the second anode contact.

5. The organic light-emitting diode device as claimed in claim 1, wherein the first cathode electrical contact has a surface homothetic to the surface of the first region and/or to the surface of the active common zone.

6. The organic light-emitting diode device as claimed in claim 1, wherein
  if $0.1 \leq r < 1.75$, then $20\% \leq D1/L1 \leq 50\%$ and $20\% \leq D2/L2 \leq 50\%$,
  if $1.75 \leq r < 2.5$, then $20\% \leq D1/L1 \leq 40\%$ and $20\% \leq D2/L2 \leq 40\%$,
  if $2.5 \leq r < 3$, then $20\% \leq D1/L1 \leq 35\%$ and $20\% \leq D2/L2 \leq 35\%$,
  if $3 \leq r \leq 5$, then $15\% \leq D1/L1 \leq 25\%$ and $15\% \leq D2/L2 \leq 25\%$.

7. The organic light-emitting diode device as claimed in claim 1, wherein the first anode contact is along a first edge of the active common zone, and optionally the second anode contact is along a second edge of the active common zone opposite from the first edge.

8. The organic light-emitting diode device as claimed in claim 1, wherein the first anode contact is substantially rectilinear and defined by a first mid-plane and the second anode contact is substantially rectilinear and defined by a second mid-plane, and an angle α between the first and second mid-planes is less than 45°.

9. The organic light-emitting diode device as claimed in claim 1, comprising one or more resistive anode electrical contacts, arranged in the first region and wherein the ratio r ranging from 0.1 to 5 is replaced with a ratio r'=R2/R'1 ranging from 0.1 to 5 in which R'1 is the equivalent sheet resistance of the assembly of the anode and the one or more resistive anode electrical contacts in the first region.

10. The organic light-emitting diode device as claimed in claim 1, wherein the cathode is transparent or semi-reflecting, wherein the reflector comprises a reflecting covering element above the cathode away from the first main face, the covering element being separated from the cathode by an electrical insulating element and wherein the first cathode electrical contact, adjacent to the electrical insulating element, forms part of the reflector and is in contact or electrically coupled with the reflecting covering element.

11. The organic light-emitting diode device as claimed in claim 10, wherein the first cathode electrical contact is based on the same material as the reflecting covering element, and the first cathode electrical contact and the covering element are formed by a continuous layer on the electrical insulating element.

12. The organic light-emitting diode device as claimed in claim 11, wherein the continuous layer is based on the same material as the cathode.

13. The organic light-emitting diode device as claimed in claim 12, wherein the cathode comprises a layer based on aluminum and the first cathode electrical contact comprises a layer based on aluminum.

14. The organic light-emitting diode device as claimed in claim 1, wherein the reflector comprises a Bragg mirror, adjacent to the first cathode electrical contact, and the first cathode electrical contact forms part of the reflector.

* * * * *